United States Patent [19]

Akagi et al.

[11] Patent Number: 4,739,379
[45] Date of Patent: Apr. 19, 1988

[54] HETEROJUNCTION BIPOLAR INTEGRATED CIRCUIT

[75] Inventors: Junko Akagi, Kawasaki; Jiro Yoshida; Makoto Azuma, both of Yokohama, all of Japan

[73] Assignee: Kabushiki Kaisha Toshiba, Kawasaki, Japan

[21] Appl. No.: 878,661

[22] Filed: Jun. 26, 1986

[30] Foreign Application Priority Data

Sep. 17, 1985 [JP] Japan .................. 60-203328

[51] Int. Cl.⁴ .................. H01L 29/205; H01L 29/72
[52] U.S. Cl. ........................ 357/16; 357/34; 357/45; 357/47; 357/49; 307/455
[58] Field of Search ............. 357/16, 34, 47, 45, 357/49; 307/455

[56] References Cited

U.S. PATENT DOCUMENTS

| | | | |
|---|---|---|---|
| 3,638,202 | 1/1972 | Schroeder | 357/45 |
| 4,063,271 | 12/1977 | Bean et al. | 357/49 |
| 4,236,294 | 12/1980 | Anantha et al. | 357/49 |
| 4,570,330 | 2/1986 | Cogan | 357/49 |
| 4,573,064 | 2/1986 | Mclevige et al. | 357/34 |
| 4,586,071 | 4/1986 | Tiwari | 357/34 |
| 4,649,411 | 3/1987 | Biritella | 357/16 |

OTHER PUBLICATIONS

Proceedings of the IEEE, vol. 70, No. 1, Jan. 1982, pp. 13-25, IEEE, New York, US; H. Kroemer: "Heterostructure Bipolar Transistors and Integrated Circuits", p. 20, right-hand column, chapter VI—p. 23, left-hand column, line 11 from the bottom.
IEEE Electron Device Letters, vol. EDL-5, No. 3, Mar. 1984, pp. 99-100, IEE, New York, US; C. G. Fonstad: "Consideration of the Relative Frequency Performance Potential of Inverted Heterojunction n-p-n Transistors".
Electronics International, vol. 55, No. 22, Nov. 1982, pp. 93-96, New York, US; D. Buhanan: "CML Scraps Emitter Follower for ECL Speed, Lower Power".
Review of the Electrical Communication Laboratories, vol. 21, No. 9-10, Sep.-Oct. 1973, pp. 571-581, Tokyo, JP; K. Kawashima et al: "Model DL-2H NTL-LSI Evaluation System for Computer Logics", p. 572, left--hand column, line 1—p. 577, right-hand column, line 22; FIGS. 5, 8.

Primary Examiner—Andrew J. James
Assistant Examiner—Jerome Jackson
Attorney, Agent, or Firm—Oblon, Fisher, Spivak, McClelland & Maier

[57] ABSTRACT

A heterojunction bipolar integrated circuit is disclosed which uses a heterojunction bipolar transistor with a heterojunction between an emitter region and a base region. In this transistor, a pn junction between the base region and the emitter region has a greater area than a pn junction between the base region and a collector region. A plurality of such heterojunction bipolar transistors are isolated on a substrate to perform logic operations in an unsaturated region.

10 Claims, 8 Drawing Sheets

WAVEFORM OF 5-STAGE RING
OSCILLATION IN NON-SATURATED CIRCUIT

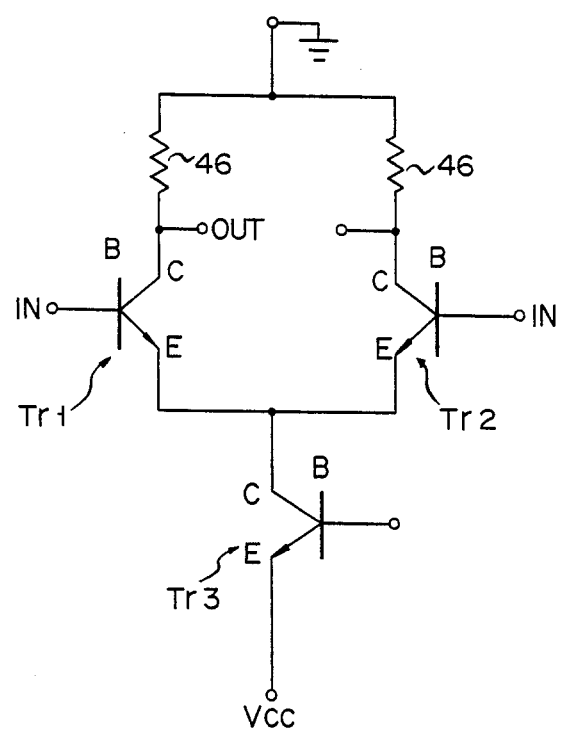
F I G. 7

F I G. 8
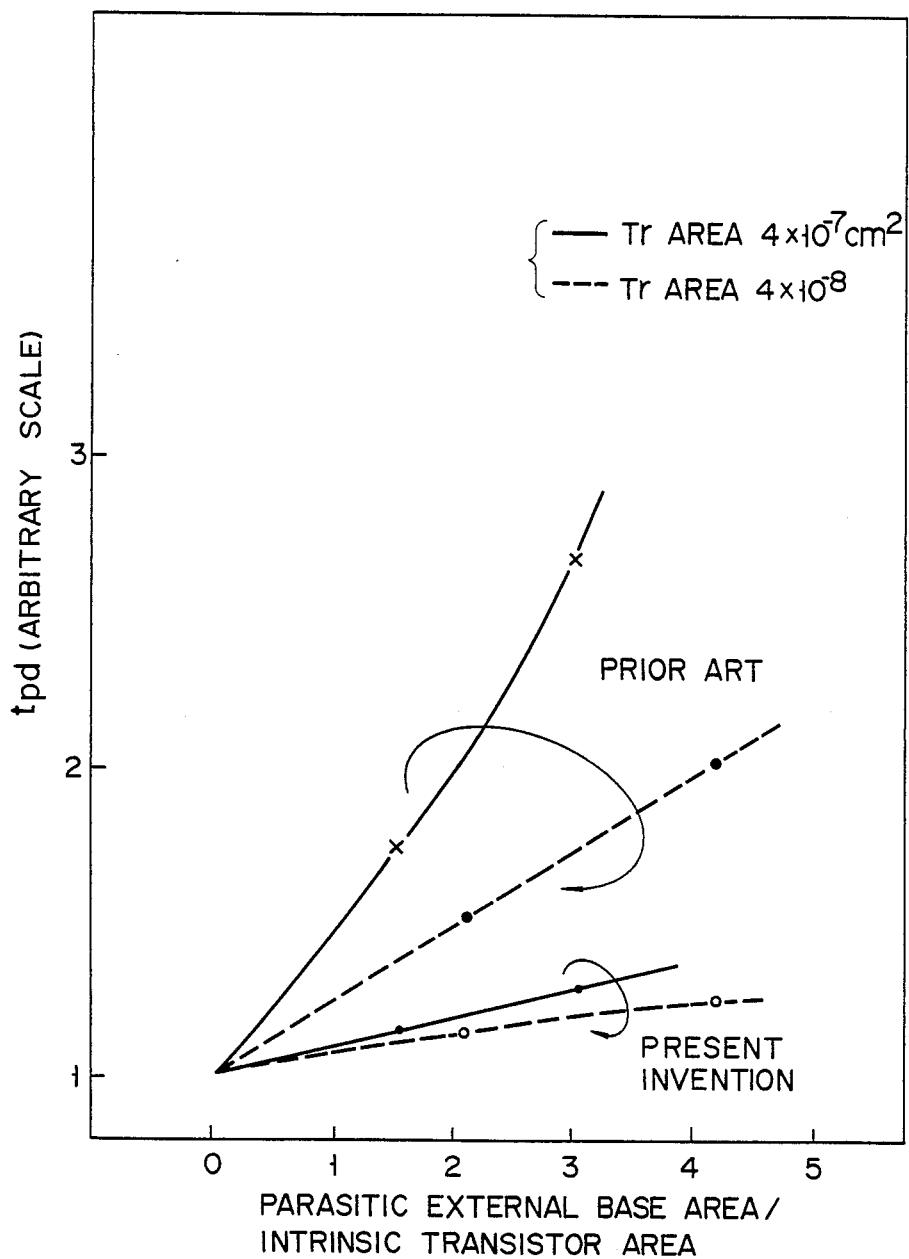

HETEROJUNCTION BIPOLAR INTEGRATED CIRCUIT

BACKGROUND OF THE INVENTION

The present invention relates to a heterojunction bipolar integrated circuit which uses a heterojunction bipolar transistor with a heterojunction between its emitter and base regions to constitute an unsaturated logic circuit.

It is well known that heterojunction bipolar transistors, having an emitter region formed from a material with a wider bandgap than that of the base region, offer numerous advantages over homojunction bipolar transistors, which have a homojunction between their emitter and base regions. These advantages can be summarized as follows.

(1) The emitter injection efficiency can be increased by making use of the difference in bandgaps, even if the ratio between impurity concentrations of the emitter and base regions is small.

(2) Base resistance can be reduced, since the base impurity concentration can be set to a high value as a result of (1) above.

(3) Emitter junction capacitance can be reduced since the impurity concentration of the emitter region can be set to a low value.

Heterojunction bipolar transistors thus offer superior high frequency and switching characteristics over homojunction bipolar transistors, and are particularly promising for use in microwave and high-speed logic circuit transistors.

FIG. 1 is a simple sectional view of the structure of a heterojunction bipolar transistor used in a conventional logic circuit. The transistor has the structure illustrated in order to facilitate extraction of the base electrode. In this extracted base electrode, there is a parasitic diode like the one shown in region b. The area of the junction between the base and collector regions increases due to the presence of this parasitic diode, and hence the junction capacitance between the base and collector regions also increases. Since the product of junction capacitance, between the base and collector regions, and load resistance, are the main factors determining the switching speed, an increased junction capacitance between the base and collector regions means degraded high-speed characteristics for the logic circuit composed of this type of transistor.

In logic circuits of this conventional structure, then, there is a parasitic external base region (region b) on the collector region side of the transistor. As a result, the capacitance on the collector region side is several times greater than the junction capacitance between the base and collector regions in an intrinsic transistor, thus negating much of the advantage offered by the good, high-speed characteristics of heterojunction bipolar transistors.

In order to resolve this problem, H. Kroemer describes a logic circuit using inverted structure (C-top) hetero-bipolar transistors in his article, "Heterostructure Bipolar Transistors and Integrated Circuits", Proc. IEEE, Vol. 70, 1982, pp. 13–25. In the heterojunction bipolar transistor described, however, an emitter layer is used in common by each transistor. As a result of the specific resistance of this emitter layer, differences appear in the voltage applied to each transistor, i.e., voltage $V_{BE}$ applied between the base and emitter, and uniform operation of the respective transistors is compromised.

SUMMARY OF THE INVENTION

It is an object of the present invention to provide a heterojunction bipolar integrated logic circuit which takes advantage of the high-speed characteristics offered by a heterojunction bipolar transistor.

It is another object of the present invention to provide an integrated logic circuit constituted by inverted structure heterojunction bipolar transistors and capable of uniform operation.

In order to achieve the above objects, a heterojunction bipolar transistor according to the present invention comprises:

a substrate;

a plurality of heterojunction bipolar transistors formed on the substrate, each having at least
  an emitter region consisting of a first type of semiconductor,
  a base region constituting a pn junction with the emitter region, and consisting of a second type of semiconductor with a bandgap narrower than that of the emitter region, and
  a collector region constituting a pn junction with the base region, and consisting of the first or second type of a semiconductor, the pn junction between the base and emitter regions having a larger area than the pn junction between the base and collector regions;

element isolating means for isolating the plurality of heterojunction bipolar transistors on the substrate; and means for connecting the plurality of heterojunction bipolar transistors with wiring and for allowing them to carry out logic operations in an unsaturated region.

In the transistor constituting the logic circuit of the present invention, a parasitic external base region is formed between the base and emitter regions rather than between the base and collector regions. As described above, the doping concentration can be set at a desired level in a heterojunction bipolar transistor. Hence, the junction capacitance between the base and emitter regions can be reduced to a low level. In addition, by making the circuit an unsaturated one, variations in voltage between the base and emitter regions during switching can be kept small. As a result, the influence of a parasitic external base region, formed between the base and emitter regions, is significantly smaller than that of one formed between the base and collector regions.

This will become clear from the following. Switching times were evaluated by computer simulation for the cases when the parasitic external base region is: (1) on the emitter region side; and (2) on the collector region side. The logic circuits tested used NTL (nonthreshold logic), CML (current-mode logic) and CML with EF (current-mode logic with emitter follower), which perform the typical unsaturated logic operation; and DCTL (direct-coupled transistor logic) which performs the saturated logic operation. The results of calculating propagation delay time $t_{pd}$, with a 5-stage ring oscillator simulation for the two cases above, are shown in FIG. 2. Ratio $t_{pd}(1)/t_{pd}(2)$, between the propagation delay times of cases (1) and (2), is plotted along the axis of the ordinate in FIG. 2. It can be seen that, when the ratio $t_{pd}(1)/t_{pd}(2)$ is 1, the result is the same whether the parasitic external base region is on the emitter side or on the collector side. For all the circuits, as is clear from the graph, an increased external base area brings about a reduction in ratio $t_{pd}(1)/t_{pd}(2)$, and an external base region on the emitter region side provides better high speed operation characteristics. This phenomenon depends on the following reason. In case (1), a current either begins to flow in the external base region or is cut off during the ON/OFF operation. The time required for this is the delay in the rise and fall of the emitter current in an intrinsic transistor. In case (2), the emitter current rises immediately. However, because the external base region is on the collector side, switching of the current flowing in the load is delayed. The fall of the current in the external base region is particularly slow during the OFF operation, and this leads to switching delays.

Further, when the parasitic external base region is on the emitter region side as in case (1), a forward biasing of the base-emitter junction in the transistor causes a similar forward biasing of the parasitic external base region. By making the parasitic junction of the external base region a homojunction of substances having wide bandgaps, however, the built-in voltage can be made larger than in the base-emitter junction of an intrinsic transistor. As a result, the current flowing in the parasitic external base region can be made negligibly small under DC characteristics.

As is clear from FIG. 2, ratio $t_{pd}(1)/t_{pd}(2)$ is clearly smaller for the unsaturated operation NTL and CML gates than for the saturated operation DCTL gate. In other words, the advantage of putting the external base region on the emitter region side is significant in unsaturated operation logic circuits. The reason for this is that in saturated operation circuits, the operating voltage range is wide and the ON/OFF time of the emitter current is too large to ignore. Thus, there is little difference between cases (1) and (2). In unsaturated operation circuits, on the other hand, the proportion of emitter charging and discharging time in switching time is extremely small. Hence, switching time is mostly determined by the discharging time of collector capacitance, so there is large difference between cases (1) and (2). In unsaturated operation circuits, case (1) is clearly advantageous.

The above point will now be explained in more detail. FIGS. 3 and 4 show waveforms of the 5-stage ring oscillator simulations for the DCTL (saturated) and CML (unsaturated) circuits. Note the ON portions in both graphs. When the saturated circuit is ON, diode current $I_D$ and emitter current $I_E$ flow. In the rise portion, however, small impulse 10 appears and collecter current IC cannot flow. Impulse 10 is a current component generated by the emitter capacitance upon variations in voltage $V_{BE}$ between the base and emitter.

In the unsaturated circuit of FIG. 4 also, currents $I_D$ and $I_E$ begin to flow. However, there is no impulse in emitter current $I_E$, and there is only a small delay in collector current $I_C$ with respect to emitter current $I_E$. This is because, in an unsaturated circuit, the rate of change in $V_{BE}$ and hence the current generated by the emitter capacitance is small.

When collector capacitance $C_C$ and emitter capacitance $C_E$ of the conventional emitter-top (E-top) heterojunction bipolar transistor (HBT) and the collector-top (C-top) heterojunction bipolar transistor of the present invention are compared, the following relations are obtained:

$$C_C \text{ (E-top)} > C_C \text{ (C-top)}$$

$$C_E \text{ (E-top)} < C_E \text{ (C-top)}$$

In an unsaturated logic circuit, as described above, the effect of emitter capacitance $C_E$ on switching speed is small. Hence, collector capacitance $C_C$ becomes a main factor determining switching speed. In other words, the C-top HBT, having a small $C_C$ value, can offer better high speed operation characteristics than the E-top HBT. In saturated logic circuits, although collector capacitance $C_C$ is the main factor determining switching speed, the effect of $C_E$ cannot be ignored. Therefore, the difference in switching speeds between C-top and E-top HBTs is smaller for saturated circuits than for unsaturated circuits.

Therefore, the present invention uses a heterojunction bipolar transistor formed with a parasitic external base region on the emitter region side to constitute an unsaturated logic circuit, and can therefore provide a logic circuit capable of high speed operation.

In addition, according to the heterojunction bipolar integrated logic circuit of the present invention, each inverted structure transistor is isolated on the surface of the substrate, thus allowing uniform operation of each transistor.

BRIEF DESCRIPTION OF THE DRAWINGS

Other objects and advantages of the present invention will be apparent from the following description, taken in conjunction with the accompanying drawings, in which:

FIG. 7 is a circuit diagram of the heterojunction bipolar integrated circuits in FIGS. 5 and 6;

FIG. 8 is a graph showing the relationship of parasitic external base area/intrinsic transistor area to propagation delay time $t_{pd}$ in the conventional and present invention.

DETAILED DESCRIPTION OF THE PREFERRED EMBODIMENTS

Figure 1:
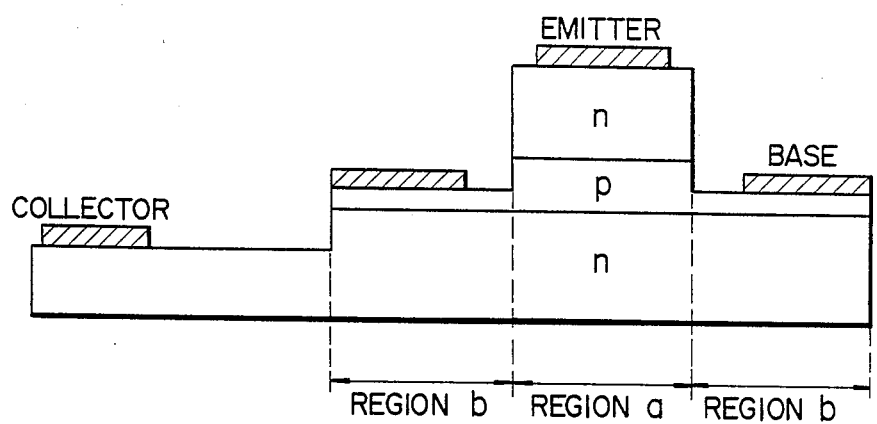
FIG. 1 is a sectional view of a conventional heterojunction bipolar transistor.
Figure 2:
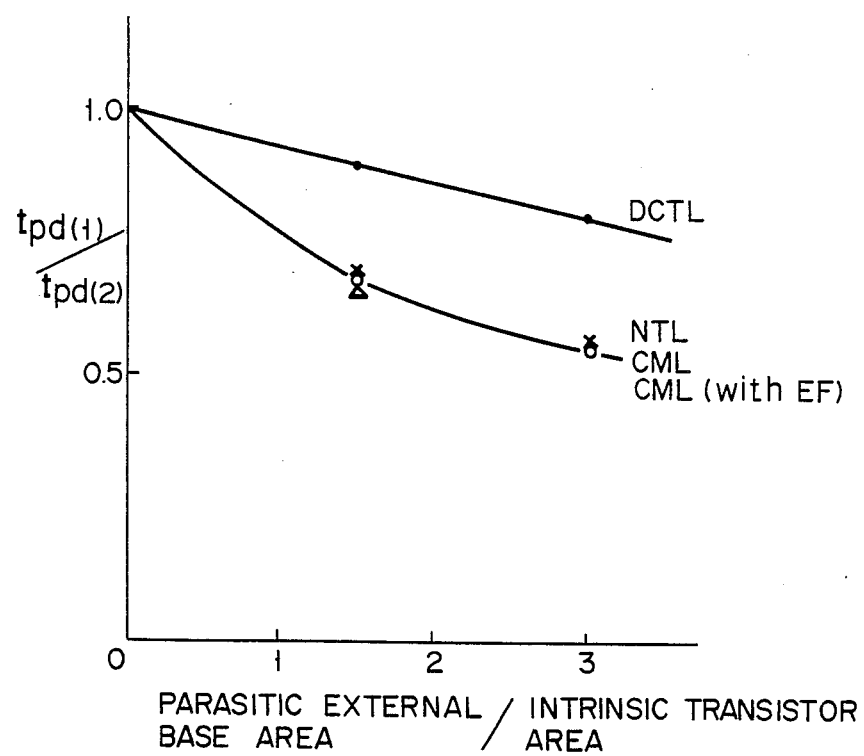
FIG. 2 is a graph showing the relationship of parasitic external base area/intrinsic transistor area to the ratio of propagation delay times, $t_{pd}(1)/t_{pd}(2)$, for various logic circuits.
Figure 3:
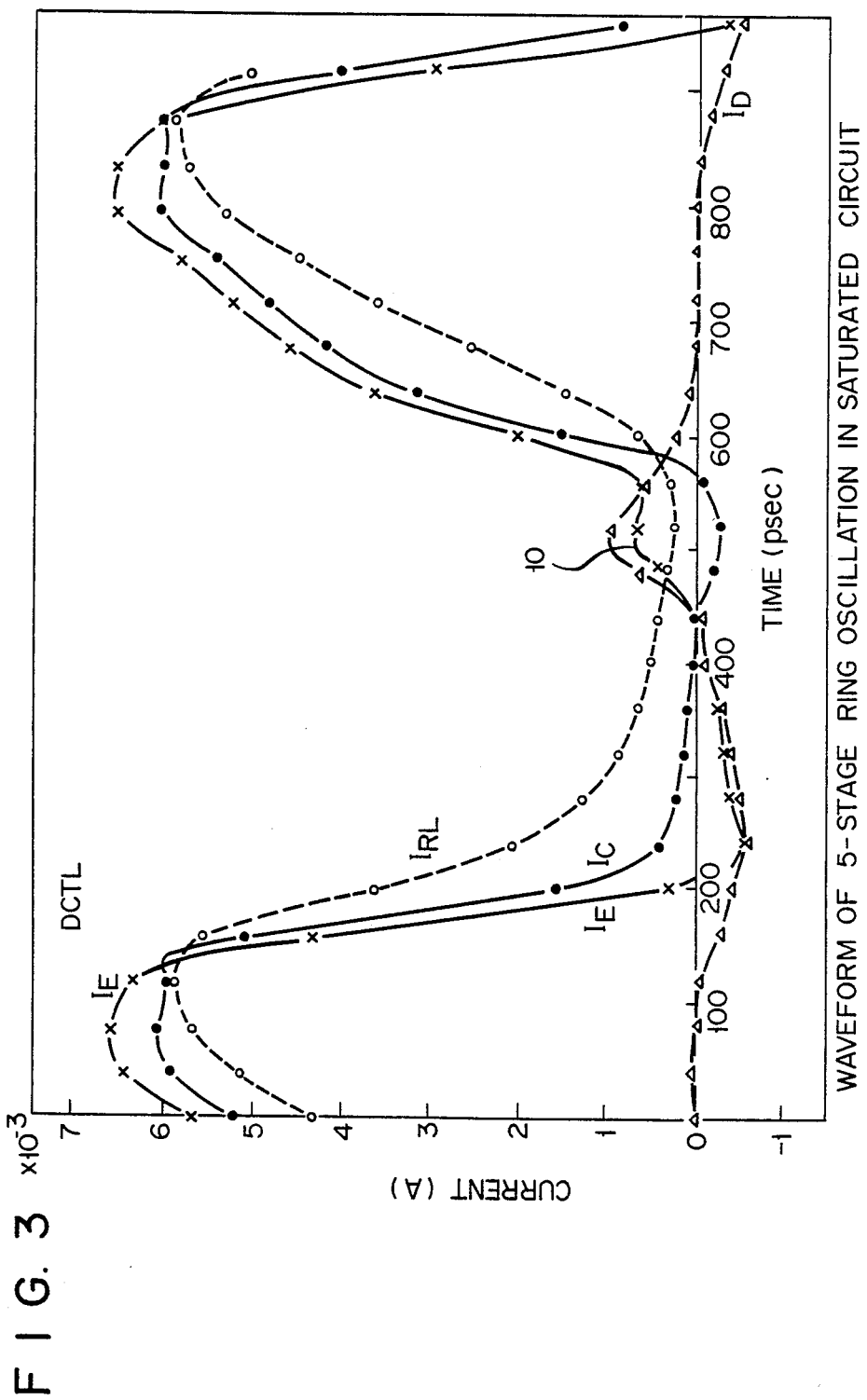
FIG. 3 is a graph showing a 5-stage ring oscillation waveform for a DCTL which is a saturated logic circuit.
Figure 4:
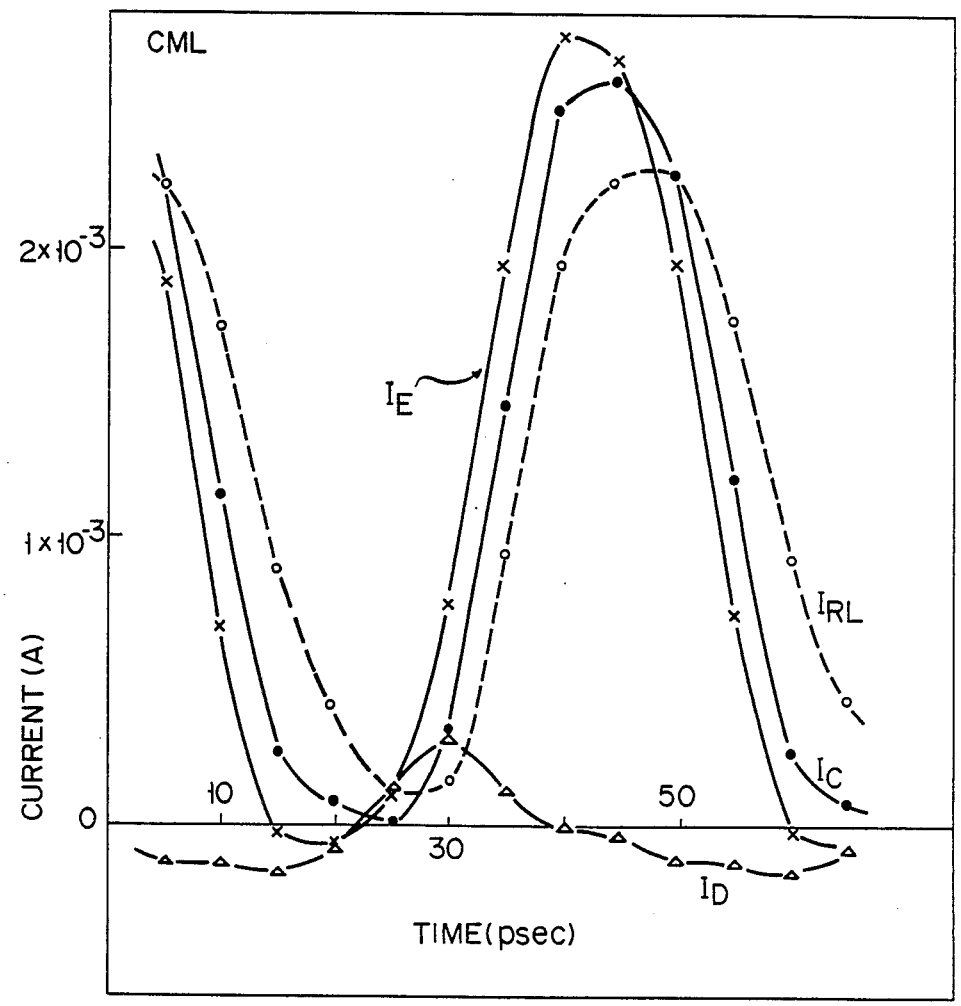
FIG. 4 is a graph showing a 5-stage ring oscillation waveform for a CML which is an unsaturated logic circuit.
Figure 5:
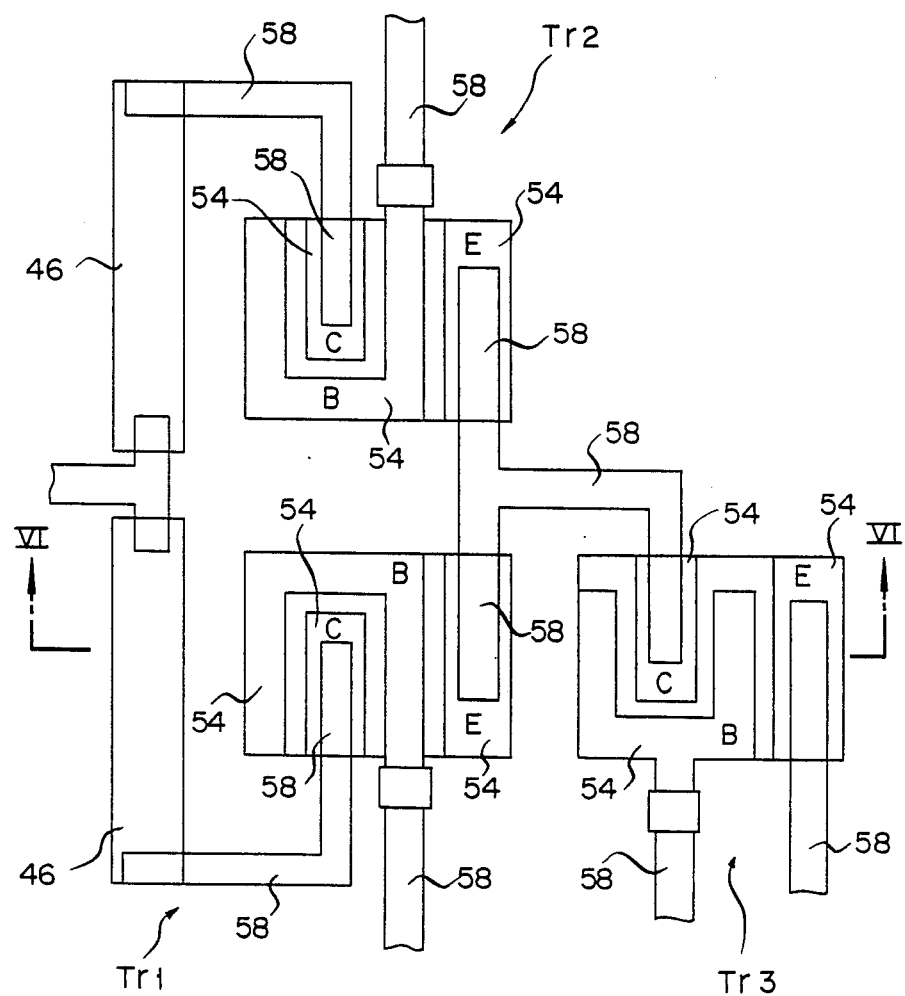
FIG. 5 is a plan view of a heterojunction bipolar integrated circuit according to the first embodiment of the present invention.
Figure 6:
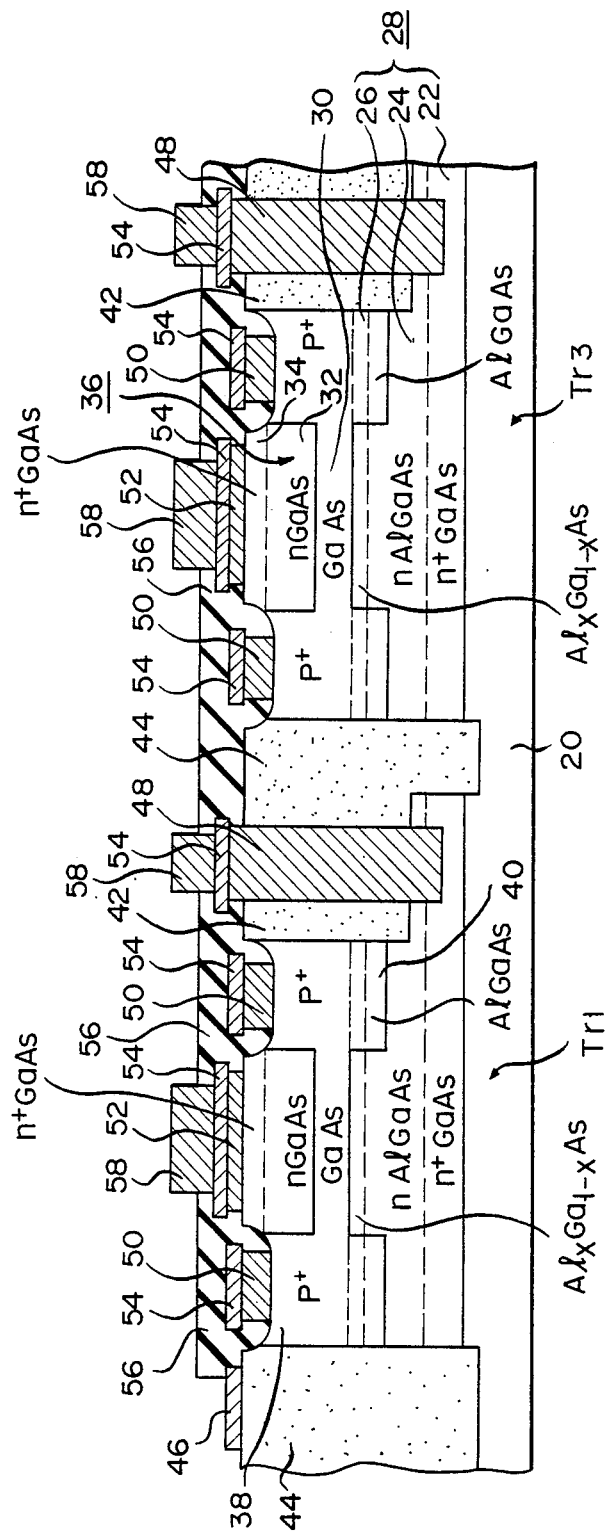
FIG. 6 is a sectional view taken along the line VI—VI in FIG. 5.

A first embodiment of a heterojunction bipolar integrated circuit according to the present invention will now be described with reference to FIGS. 5 to 7.

The heterojunction bipolar transistor of this embodiment is a collector-top transistor whose uppermost layer is a collector region. The base region is constituted by GaAs, and the emitter region (the portion forming a junction with the base region) is constituted by $Al_{0.3}Ga_{0.7}As$, which has a wider bandgap than the base region. The heterojunction bipolar transistors of this embodiment are connected by wiring to constitute a CML (current-mode logic) which is an unsaturated logic circuit.

In manufacturing a logic circuit with this heterojunction bipolar transistor, semiconductor layers must be sequentially grown with an epitaxial method on a semi-insulating substrate. Both MBE (molecular beam epitaxy) and MOCVD (metal organic chemical vapor deposition) can be used. The example in FIGS. 5 and 6 was manufactured using MBE in the following manner:

First, n+-type GaAs layer 22, with a thickness of 5,000 Å and an impurity (Si) concentration of $2 \times 10^{18} cm^{-3}$, is formed on semi-insulating GaAs substrate 20. An n-type $Al_{0.3}Ga_{0.7}As$ layer 24, with a thickness of 3,300 Å and an impurity (Si) concentration of $3 \times 10^{17} cm^{-3}$, is formed on GaAs layer 22. An n-type $Al_xGa_{1-x}As$ layer (transition region) 26, with a thickness of 200 Å and an impurity (Si) concentration of $3 \times 10^{17} cm^{-3}$, and whose Al ratio $\times$ changes continuously or in stages from 0 to 0.3, is then formed on layer 24. Layers 22, 24, and 26 constitute n-type emitter region 28.

Region 28 can also be constituted by a first type of semiconductor, i.e., AlGaAs, with a wider bandgap than the base region which is formed above this region. Since any increase in the impurity concentration of AlGaAs is limited, however, the portion outside the area constituting the pn junction with the base region, consists of a second type of semiconductor, i.e., GaAs, in this embodiment. In the claims, it is stated that the emitter region consists of the first type of semiconductor. This means, therefor, that at least the portion constituting the pn junction with the base region, consists of the first type of semiconductor. It does not means that the entire emitter region consists of the first type of semiconductor.

P+-type GaAs layer 30, with a thickness of 1,000 Å and an impurity concentration of $3 \times 10^{18} cm^{-3}$, is then formed on transition region 26, to serve as a base region. Layer 30 constitutes a pn heterojunction with emitter region 28. Be is used as the p-type impurity in this base region. An n-type GaAs layer 32, with a thickness of 3,500 Å and an impurity concentration of $1 \times 10^{17} cm^{-3}$, and n+-type GaAs layer 34, with a thickness of 1,000 Å and an impurity concentration of $2 \times 10^{18} cm^{-3}$, are then formed on the base region. Layers 32 and 34 constitute collector region 36, and a pn junction with the base region is formed. This completes the wafer formation process.

Next, a CML gate is formed. First, external base region 38 is formed by selective ion implantation for the purpose of forming contacts for the base region. This ion implantation is performed, for example, using Mg, at a dose of $2 \times 10^{14} cm^{-2}$ and an acceleration voltage of 200 KeV. The impurity is implanted as deep as the surface of AlGaAs layer 24, which constitutes the emitter region. As a result p+-type AlGaAs layer 40 is formed.

Isolation region 42 is then formed to isolate the base and emitter regions in the transistor. Isolation region 44 is also formed in order to isolate the transistors. Regions 42 and 44 can be formed by the selective ion implantation of an impurity such as H+ or B+. The surface of external base region 38 is then etched to isolate region 38 and layer 34 of collector region 36.

NiCr or the like is deposited on region 44 and patterned to form a layer constituting load resistor 46. Etching is performed from the wafer surface to layer 22 of the emitter region, to form the contacts for the emitter region. A thin AuGe layer is formed on the etched portion, and an Au layer is formed on the AuGe layer, to form emitter electrode 48.

AuZn is then deposited on region 38 and patterned to form base electrode 50. An AuGe layer is formed, on GaAs layer 34, and an Au layer also, is formed thereon, to form collector electrode 52. A Ti-Pt-Au layer is then formed on the emitter, base, and collector electrodes, to form first wiring layer 54. Insulating layer 56 of $SiO_2$ or the like, is then formed on layer 54 by CVD or a similar method.

Contact holes for connecting first wiring layer 54 to second wiring layer 58 are formed by etching. Layer 58 is then formed on the contact holes with Ti-Pt-Au or the like. This second wiring layer 58 completes the preparation of a one-gate CML circuit shown in FIG. 7.

The switching characteristics of a CML gate of the present invention and a conventional CML gate, were evaluated using 5-stage ring oscillator simulation, and the results are shown in FIG. 8. The CML gate of the present invention is composed of a heterojunction bipolar transistor whose base-emitter junction area is larger than its base-collector junction area, and whose base region contacts are formed above a portion of the base-emitter junction. The conventional CML gate is comprised of a heterojunction bipolar transistor whose base-collector junction area is larger than its base-emitter junction area. As is clear from the graph, even if the external base area increases, the increase in propagation delay time $t_{pd}$ in the embodiment of the present invention is extremely small in the case where the intrinsic transistor area is $4 \times 10^{-7}$ or $4 \times 10^{-8} cm^2$, compared with that of the conventional gate. Since the external base area is normally about twice the intrinsic transistor area, the present invention can bring about an improvement in propagation delay time of about ½ to ⅔ over the conventional device. In spite of this, power consumption in the device of the present invention is almost the same as in the conventional device. Thus, the present invention enables significant improvements in propagation delay time without increased power consumption.

In the above embodiment, the base and emitter regions are formed with GaAs and $Al_{0.3}Ga_{0.7}As$, respectively. The mole ratio of the Al in the emitter region is not limited to 0.3. The present invention can be applied to cases where the base and emitter regions are formed with other semiconductor combinations, such as InGaAs and InP, InGaAs and InAlAs, Ge and GaAs, and Si and GaP. The collector region may be formed by another type of semiconductor material.

Figure 9:
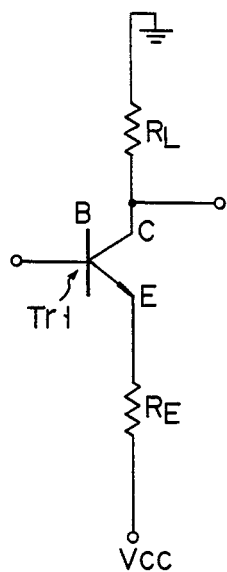
FIGS. 9 and 10 are diagrams for explaining a heterojunction bipolar integrated circuit according to another embodiment of the present invention.
Figure 10:
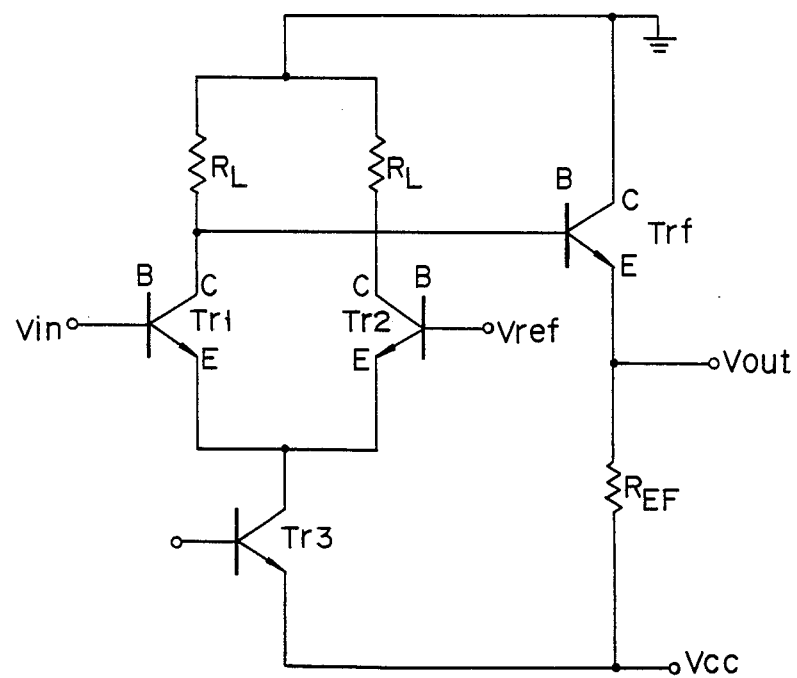

In the above embodiment, a CML is exemplified, but the present invention is equally effective when other unsaturated-type circuits, such as NTL (non-threshold logic), shown in FIG. 9, and CML(with EF) (Trf and $R_{EF}$), shown in FIG. 10, are used. In FIGS. 9 and 10, $R_L$ denotes a load resistance.

What is claimed is:
1. A heterojunction bipolar integrated circuit comprising:
   a semi-insulating semiconductor substrate;
   a plurality of heterojunction bipolar transistors formed on said substrate, each having at least an emitter region consisting of a first type of semiconductor and formed on said semi-insulating semiconductor substrate, a base region constituting a pn junction with said emitter region, consisting of a second type of semiconductor with a bandgap narrower than that of said emitter region, and formed on said emitter region, and a collector region constituting a pn junction with said base region, consisting of the first or second type of semiconductor, and formed on said base region, said pn junction between said base and emitter regions having a larger area than said pn junction between said base and collector regions;

an ion-implanted region for isolating said respective heterojunction bipolar transistors on said substrate, said ion-implanted region reaching said semi-insulating semiconductor substrate; and means for connecting said plurality of heterojunction bipolar transistors with wiring, and for allowing said transistors to carry out current-mode logic operations.

2. The circuit according to claim 1, wherein each of said plurality of bipolar transistors comprises:
an emitter region formed on said substrate;
a base region formed on said emitter region; and
a collector region formed on said base region.

3. The circuit according to claim 1, wherein said first type of said semiconductor comprises AlGaAs.

4. The circuit according to claim 3, wherein said first type of said semiconductor comprises:
a transition region in which an Al ratio in the AlGaAs increases from a base region side to an emitter region side; and
a region in which the Al ratio is fixed.

5. A heterojunction bipolar integrated circuit comprising:
a semi-insulating semiconductor substrate;
a plurality of heterojunction bipolar transistors formed on said substrate, each having at least
an emitter region consisting of a first type of semiconductor and formed on said semi-insulating semiconductor substrate,
a base region constituting a pn junction with said emitter region, consisting of a second type of semiconductor with a bandgap narrower than that of said emitter region, and formed on said emitter region, and
a collector region constituting a pn junction with said base region, consisting of the first or second type of semiconductor, and formed on said base region, said pn junction between said base and emitter regions having a larger area than said pn junction between said base and collector regions;

an ion-implanted region for isolating said respective heterojunctional bipolar transistors on said substrate, said ion-implanted region reaching said semi-insulating semiconductor substrate; and means for connecting said plurality of heterojunction bipolar transistors with wiring, and for allowing said transistors to carry out current-mode logic operations with emitter follower.

6. The circuit according to claim 5, wherein said first type of said semiconductor comprises AlGaAs.

7. The circuit according to claim 6, wherein said first type of said semiconductor comprises:
a transition region in which an Al ratio in the AlGaAs increases from a base region side to an emitter region side; and
a region in which the Al ratio is fixed.

8. A heterojunction bipolar integrated circuit comprising:
a semi-insulating semiconductor substrate;
a plurality of heterojunction bipolar transistors formed on said substrate, each having at least
an emitter region consisting of a first type of semiconductor and formed on said semi-insulating semiconductor substrate,
a base region constituting a pn junction with said emitter region, consisting of a second type of semiconductor with a bandgap narrower than that of said emitter region and formed on said emitter region, and
a collector region constituting a pn junction with said base region, consisting of the first or second type of semiconductor, and formed on said base region, said pn junction between said base and emitter regions having a larger area than said pn junction between said base and collector regions;

an ion-implanted region for isolating said respective heterojunction bipolar transistors on said substrate, said ion-implanted region reaching said semi-insulating semiconductor substrate; and means for connecting said plularity of heterojunction bipolar transistors with wiring, and for allowing said transistors to carry out non-threshold operations.

9. The circuit according to claim 8, wherein said first type of said semiconductor comprises AlGaAs.

10. The circuit according to claim 9, wherein said first type of said semiconductor comprises:
a transition region in which an Al ratio in the AlGaAs increases from a base region side to an emitter region side; and
a region in which the Al ratio is fixed.

* * * * *